(12) United States Patent
Perruchot et al.

(10) Patent No.: US 7,906,439 B2
(45) Date of Patent: Mar. 15, 2011

(54) METHOD OF FABRICATING A MEMS/NEMS ELECTROMECHANICAL COMPONENT

(75) Inventors: François Perruchot, Grenoble (FR); Bernard Diem, Echirolles (FR); Vincent Larrey, La Murette (FR); Laurent Clavelier, Grenoble (FR); Emmanuel Defay, Vorepe (FR)

(73) Assignee: Commissarit a l'Energie Atomique, Paris (FR)

( * ) Notice: Subject to any disclaimer, the term of this patent is extended or adjusted under 35 U.S.C. 154(b) by 0 days.

(21) Appl. No.: 12/488,898

(22) Filed: Jun. 22, 2009

(65) Prior Publication Data
US 2010/0029031 A1 Feb. 4, 2010

(30) Foreign Application Priority Data
Jun. 23, 2008 (FR) .................................... 08 03494

(51) Int. Cl.
*H01L 21/302* (2006.01)
*H01L 21/461* (2006.01)
(52) U.S. Cl. ........ 438/752; 438/456; 438/700; 438/933; 438/753; 438/311; 257/E21.32; 257/E21.129; 257/E21.115; 257/E21.151; 257/E21.227; 257/E21.229; 257/E21.249; 257/E21.293; 257/E21.304; 257/E21.17
(58) Field of Classification Search .................. 438/933, 438/700, 637, 8, 311, 456, 752, 753, 744, 438/680, 692, 381; 257/E21.17, 32, 115, 257/129, 227, 229, 249, 293, 304
See application file for complete search history.

(56) References Cited

U.S. PATENT DOCUMENTS

| 6,836,491 | B2 * | 12/2004 | Itoh ................................ 372/36 |
| 7,352,949 | B2 * | 4/2008 | Huang et al. .................. 385/142 |
| 7,671,515 | B2 * | 3/2010 | Metz et al. .................... 310/340 |
| 2009/0325335 | A1 * | 12/2009 | Perruchot et al. .............. 438/50 |

FOREIGN PATENT DOCUMENTS

| EP | 0 624 900 | A | 11/1994 |
| EP | 0 895 276 | A | 2/1999 |
| EP | 1 905 734 | A | 4/2008 |
| WO | WO 2008/006641 | A | 1/2008 |

OTHER PUBLICATIONS

International Search Report for French Application No. 08/03494, filed Jun. 23, 2008.

* cited by examiner

*Primary Examiner* — David Nhu
(74) *Attorney, Agent, or Firm* — Alston & Bird LLP

(57) ABSTRACT

The invention provides a method of fabricating and electromechanical device having an active element on at least one substrate, the method having the steps of: a) making a heterogeneous substrate having a first portion, an interface layer, and a second portion, the first portion including one or more buried zones sandwiched between first and second regions formed in a first monocrystalline material, the first region extending to the surface of the first portion, and the second region extending to the interface layer, at least one said buried zone being made at least in part out of a second monocrystalline material so as to make it selectively attackable relative to the first and second regions; b) making openings from the surface of the first portion and through the first region, which openings open out to at least one said buried zone; and c) etching at least part of at least one buried zone to form at least one cavity so as to define at least one active element that is at least a portion of the second region between said cavity and said interface layer; wherein the first and second portions of the substrate are constituted respectively from first and second substrates that are assembled together by bonding, at least one of them including at least one said interface layer over at least a fraction of its surface.

16 Claims, 8 Drawing Sheets

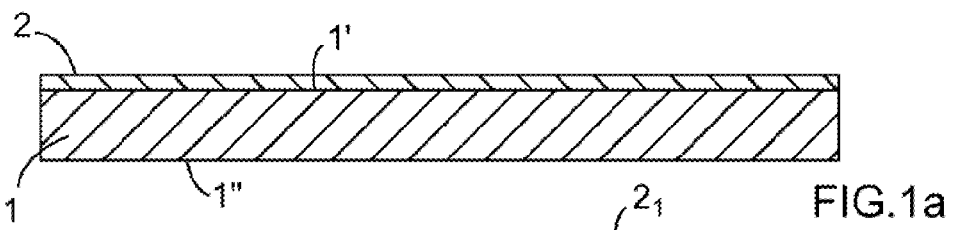
FIG.1a
FIG.1b
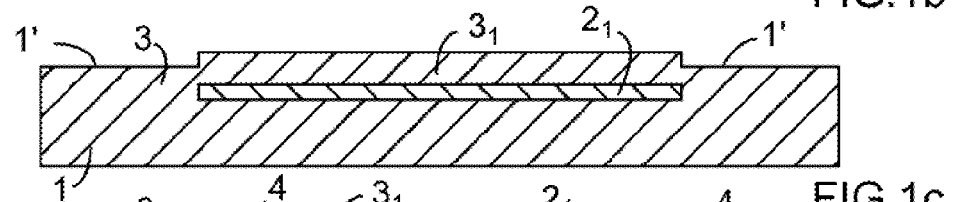
FIG.1c
FIG.1c'
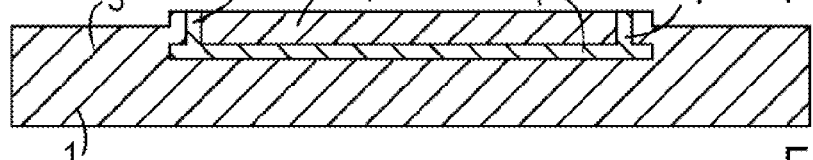
FIG.1d
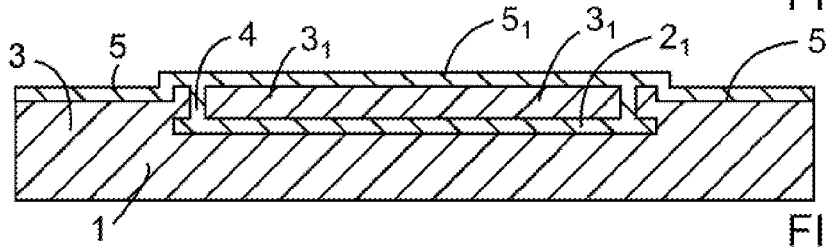
FIG.1e
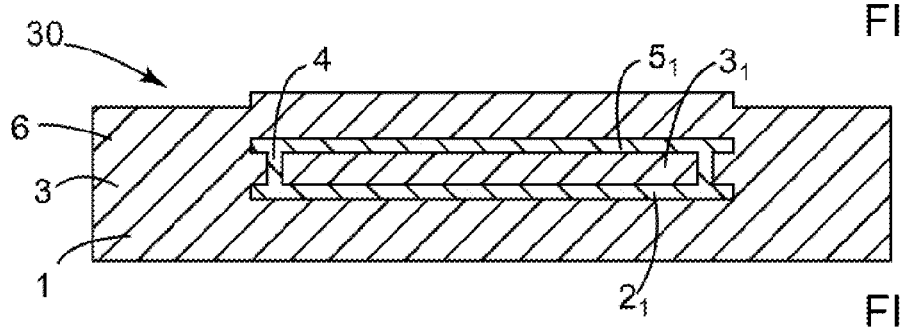
FIG.1f

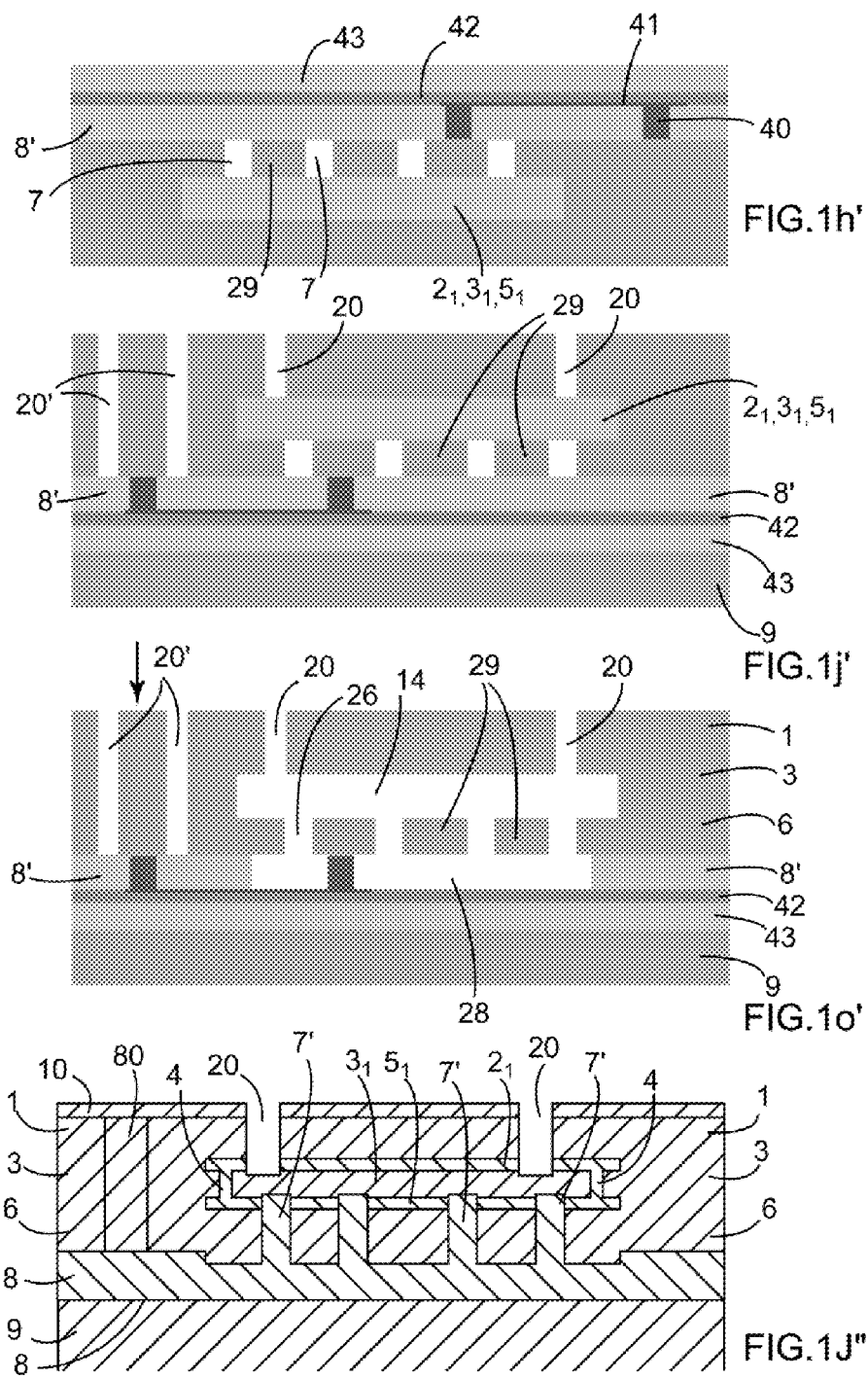

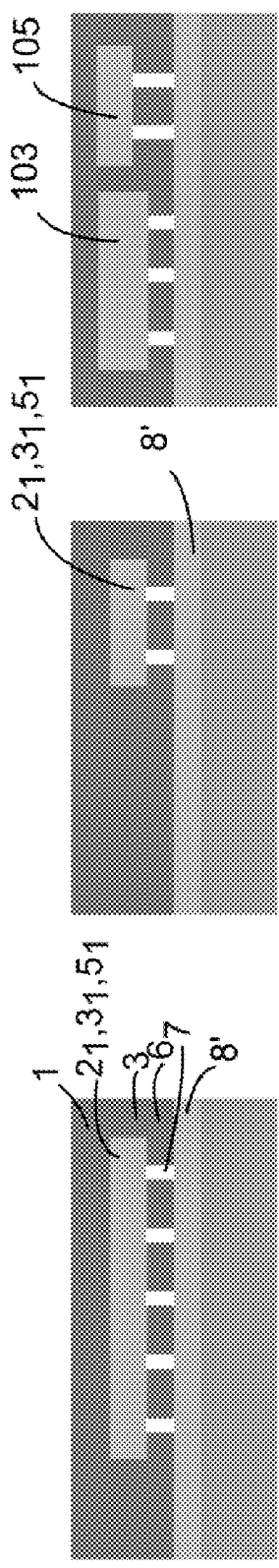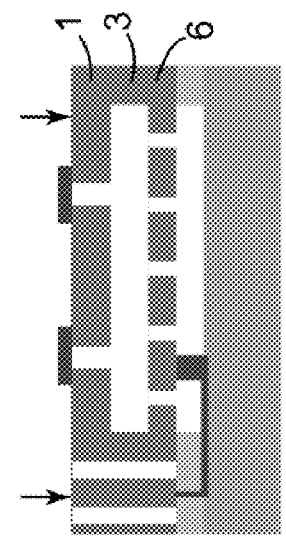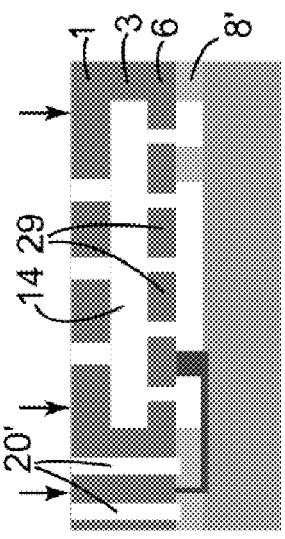

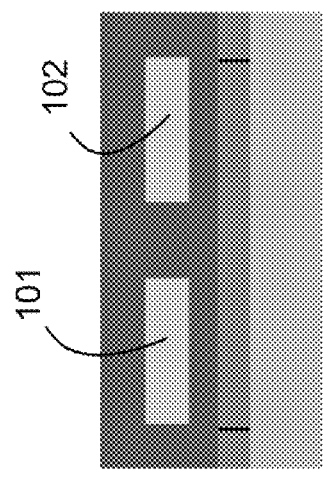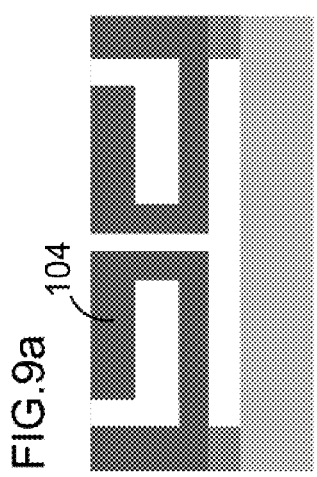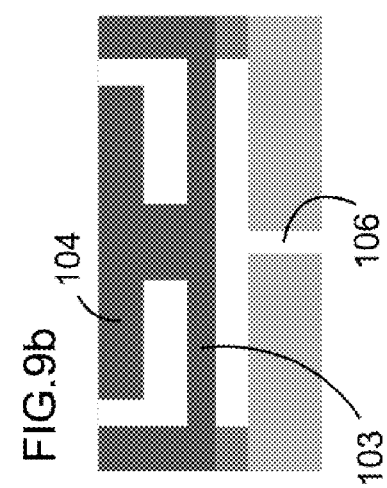
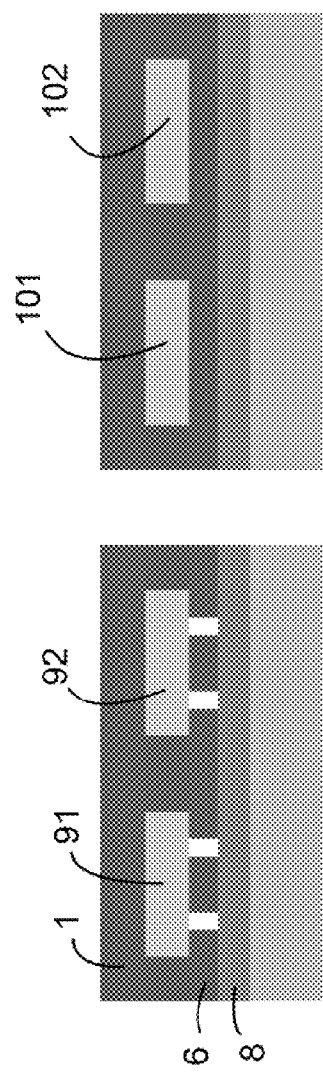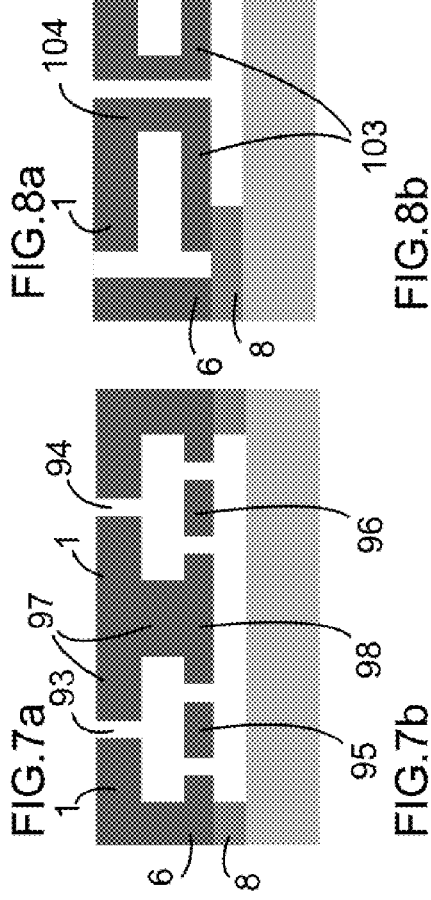

METHOD OF FABRICATING A MEMS/NEMS ELECTROMECHANICAL COMPONENT

CROSS-REFERENCE TO RELATED APPLICATIONS

The application claims priority from French application Ser. No. 08/03494, filed Jun. 23, 2008, which is hereby incorporated herein in its entirety by reference.

The present invention relates to a method of fabricating an electromechanical component of the micro-electromechanical system (MEMS) or nano-electromechanical system (NEMS) type.

BACKGROUND OF THE INVENTION

So-called surface technologies (as contrasted with bulk technologies) enable the size of electromechanical structures (MEMS/NEMS) that are made on silicon to be reduced. These technologies rely on using a stack of at least three layers: a mechanical layer (typically having a thickness of 0.1 micrometers ($\mu$m) to 100 $\mu$m); a sacrificial layer (typically 0.1 $\mu$m to 5 $\mu$m thick); and a support (typically 10 $\mu$m to 1000 $\mu$m thick). Selective chemical etching of the sacrificial layer enables functional structures to be made in the mechanical layer that are locally independent of the support. The non-etched zones of the sacrificial layer enable so-called anchor zones to be made whereby the mechanical structure is connected to the support. By extension, it is possible to speak of making active layers (with the mechanical layer as a special case) on a decoupling layer (with the sacrificial layer as a special case), the decoupling layer providing the connection between the support and the active layer. By way of example, bulk acoustic wave (BAW) type structures of the solid mounted resonator (SMR) type comprise a piezoelectric stack (active layer) on a Bragg mirror (decoupling layer) enabling acoustic isolation to be achieved between the active layer and the support.

If other functions are added between the support and the active layer, such as interconnection layers for example, it is possible to use the more general term: "interface" layer (including a decoupling layer).

One given method is characterized in particular by selecting the pair of materials for constituting the mechanical layer (or by extension the active layer) and the sacrificial layer (or by extension the interface layer), and selecting the method that enables them to be associated with the support. A method is selected using different criteria depending on the type of component being made.

For example, for a mechanical layer on a sacrificial layer, in particular silicon on $SiO_2$, the main technological criteria retained for having a method that is flexible and adaptable to a wide range of requirements are as follows:

- the quality of the mechanical layer, firstly the stability of its mechanical properties, but also the precision with which its dimensions can be controlled, and in particular its thickness;
- the possibility of controlling the lateral dimensions of anchor zones by inserting, in the sacrificial layer, zones that are not attacked by the chemical etching so as to avoid being dependent on controlling etching by duration, where such control is sensitive to the shape of the structure;
- the possibility of having one or more levels of electrical interconnection above and/or below the mechanical layer, suitable for acting as electrodes, where necessary;
- compatibility with adding a silicon cap, in particular for inertial structures; and
- the possibility of having distinct thicknesses of silicon in a single component.

The family of methods in the most widespread use rely on the silicon (mechanical layer) and silica (sacrificial layer) materials pair associated with selective etching of the silica with HF (in the liquid or the vapor phase). This family forms part of silicon-on-insulator (SOI) MEMS technology.

The simplest SOI-MEMS methods make use of two layers of $SiO_2$ and Si made by successive deposits of material, e.g. by plasma-enhanced chemical vapor deposition (PECVD) or by low pressure chemical vapor deposition (LPCVD) on a silicon support (solid silicon substrate). These methods are advantageous, because:

- the thickness of the mechanical layer is controlled by the length of time the silicon layer is deposited;
- the anchor zones are very well controlled since it is possible to use the mechanical layer directly by locally etching the oxide layer prior to depositing the silicon; and
- it is possible to make interconnections at different levels.

Nevertheless, the silicon constituting the mechanical layer deposited on the oxide is polycrystalline silicon, which makes it more difficult to control its mechanical qualities (controlling level of stresses, stability, . . . ), and puts a limit on the thickness that can be obtained.

Known improvements to those methods make it possible to use monocrystalline silicon as the mechanical layer, thus obtaining mechanical properties that are considered as being better, and also obtaining a range of accessible thicknesses that is greater.

Three major families of known methods of making MEMS out of monocrystalline silicon using SOI-MEMS technology may be mentioned, which families differ by the method used for making the substrate that includes the complete stack:

1) The starting substrate is an SOI substrate having a fine layer of Si of the microelectronic type and of controlled thickness (typically of the order of 100 nanometers (nm)), e.g. made using the so-called "Smart Cut" (registered trademark) cleaving technique. The $SiO_2$ layer provides insulation relative to the substrate and it is used as a sacrificial layer, with the fine silicon layer serving as a basis for epitaxial growth of silicon, thereby enabling a mechanical layer to be obtained that is made of monocrystalline material.

It is also known to make interconnection levels over a mechanical layer and anchors out of SiN or polycrystalline Si as described in the article "Polysilicon packaging and a new anchoring technology for thick SOI-MEMS—dynamic response model and application to over-damped inertial sensors" by B. Diem et al. (13th International Conference on Solid State Sensors, Actuators, and Microsensors, Seoul, Jun. 5-9, 2005, pp. 527-530).

2) The initial substrate is a silicon substrate having an oxide layer. The mechanical layer is made by bonding a second substrate of thick silicon which is subsequently thinned by rectification and polishing (cf. PCT application WO 2006/035031). In that method, the sacrificial layer is used as a bonding layer and the quality of bonding is critical since it must guarantee that the chemical etching is uniform. Implementing anchor zones in the sacrificial layer prior to bonding is possible, but that requires substrate bonding to be performed with heterogeneous surfaces.

3) The initial substrate is a thick silicon substrate on which there are deposited the sacrificial oxide layer and then a functionalization multilayer of SiN associated with polycrystalline Si, and finally a final bonding layer of polycrystalline Si. This initial stack is bonded onto a second silicon substrate that acts as a support. Thereafter, the thick base substrate is thinned by rectification and polishing to provide a mechanical layer that is used for the electromechanical system (cf. the article "Capacitive accelerometer with high aspect ratio single crystalline silicon microstructure using the SOI structure with polysilicon-based interconnect technique", by T. Yamamoto et al., published in MEMS 2000, the 13th International Annual Conference, Jan. 23-27, 2000, Miyazaki, Japan, pp. 514-519). The proposed method makes it possible to provide anchor zones of polycrystalline Si, interconnection layers, and buried electrodes, and the bonding layer is distinct from the sacrificial layer, which means that the quality of bonding is less critical, since it then has mechanical functions only.

For a piezoelectric stack used for BAW type structures on a Bragg mirror, the criterion for selecting the technique to use may be associated with the physical qualities of the usable materials.

The two preceding examples, namely a mechanical layer or a piezoelectric stack, show that the possibility of using an active layer made of monocrystalline material can be an important factor in selecting the technique to use.

With inertial structures or structures based on a BAW structure, it is necessary to provide a cap over the active structure both for the purpose of protecting it and also for ensuring that the atmosphere in which the structure is located is controlled in terms of pressure and composition. The cap must not give rise directly or indirectly to stresses on the component (in particular when the base substrate is thinned so as to reduce the total thickness of the device).

A first solution is to place a cutout MEMS structure in a package. That non-collective technology significantly increases the cost of the component and also increases its total volume.

Known technologies for providing protection over MEMS structures in collective manner are of two types:
either sealing a wafer of silicon having cavities over the MEMS structures. By way of example this is proposed in the method of sealing with glass frit and a contact pass under the structure (as described for example in U.S. Pat. No. 6,391,673);
or making a cap as a thin layer. For example, in above method 1), it is possible to make a cap out of polycrystalline Si on top of the MEMS structure, e.g. as described in the above-mentioned article by B. Diem.

Solutions that require a wafer of silicon to be fitted make use of a third substrate. Sealing technology requires a bonding area that is sufficient to provide mechanical strength, thereby increasing the total area of the component. Furthermore, it is not possible to connect the cap electrically to the mechanical portion of the component. Unfortunately, electrical connections are needed, for example, to control the potential of the cap, and where necessary that requires electrodes to be included therein.

Solutions exist involving fitting a silicon cap while providing an electrical connection (reference: AuSn on a component: Q. Wang et al., Application of Au—Sn eutectic bonding in hermetic radio-frequency microelectromechanical system wafer level packaging, Journal of Electronic Materials, Vol. 35, No. 3, 2006). For the time being, those technologies are usable industrially only at component scale, and in addition the connection is made with the help of a metal alloy that is complex to provide.

The solution associated with above method 1) relies on using a deposit of polycrystalline Si, and it enables contacts to be transferred via the cap. However the nature of the deposit used requires stress to be monitored, which is difficult to do industrially. Such monitoring is particularly required when the support is thinned so as to reduce the total thickness of the component. In addition, the thickness of the cap is limited to about ten micrometers, making it difficult to use the face of the cap for three-dimensional integration technologies.

In methods of the SOI type that use a monocrystalline active layer, it is not presently possible to structure the mechanical layer in the third dimension.

OBJECT AND SUMMARY OF THE INVENTION

The idea on which the invention is based is to overcome at least one of the limitations of the prior art by proposing a method that uses a heterogeneous substrate made up of one or more monocrystalline materials having one or more zones capable of being etched selectively relative to said monocrystalline materials, thus making it possible in particular to end up with one or more cavities that enable a three-dimensional structure to be made in the active layer.

By way of example, this makes it possible to make a monocrystalline silicon cap for inertial structures or for BAW type structures, and also to integrate in a single device mechanical elements of different thickness, either one beside the other, e.g. to make sensors of different sensitivities on a common component, or else one on the other, or to make electrodes above the mechanical layer.

It is also possible for BAW type structures to use certain thin layer materials in monocrystalline form to obtain physical properties, including small-thickness properties, that are close to the properties of a solid monocrystal, or that are at least better than those obtained with amorphous or polycrystalline films as made in particular by sol-gel deposition. This applies for example to lead zirconate titanate (PZT), which can be grown epitaxially from a transition layer on monocrystalline silicon (see the article "Epitaxial growth of $Pb(Zr_{0.2}Ti_{0.8})O_3$ on Si and its nanoscale piezoelectric properties", by A. Lin et al., Applied Physics Letters, Vol. 78-14, Apr. 2, 2001). This applies likewise to lead magnesium niobium titanate (PMNT).

The invention thus relates to a method of fabricating an electromechanical device including at least one active element, and comprising the following steps:

a) making a heterogeneous substrate comprising a first portion, an interface layer, and a second portion, the first portion including one or more epitaxial buried zones sandwiched between first and second regions formed in a first monocrystalline material, the first region extending to the surface of the first portion, and the second region extending to the interface layer, at least one said buried zone being made at least in part out of a second monocrystalline material so as to make it selectively attackable relative to said first and second regions;

b) making openings from the surface of the first portion and through the first region, which openings open out to at least one said buried zone; and c) etching at least part of at least one buried zone to form at least one cavity so as to define at least one active element that is at least a portion of the second region between a said cavity and said interface layer;

and wherein the first and second portions of the substrate are constituted respectively from first and second substrates that are assembled together by bonding, at least one of them including at least one said interface layer over at least a fraction of its surface.

The method of the invention makes it possible to make monocrystalline buried layers in a monocrystalline heterogeneous substrate.

It should be observed that the article "Local buried oxide technology for HV transistors integrated in CMOS" by E. Saarnilehto et al., published in Proceedings of the 19th International Symposium on Power Semiconductor Devices & ICs, May 27-30, 2007, Jeju, Korea, pp. 81-84, provides for growing Si and SiGe epitaxially in succession to make buried layers of SiGe, but that does not enable a buried cavity to be formed that has width and thickness that can be selected at will within a monocrystalline substrate, since only the SiGe layer is chemically etched in order to make the cavity. The thickness of the cavity is therefore limited to the thickness of the SiGe, and its width is limited by the selectivity of SiGe etching stopping on Si. Furthermore, French patent applications FR 2 876 219 and FR 2 876 220 provide for making buried regions of $SiO_2$, but they require bonding of an Si substrate.

The second region may present localized zones extending between at least one buried layer and the interface layer in such a manner as to define the shape of at least one active element.

The localized zones may be trenches or they may be solid and be etched after step c) so as to form trenches, e.g. by selective etching stopping on Si.

The localized zones may be solid, the interface layer may include a sacrificial layer in contact with the second region, and the method may include making at least one opening out into said sacrificial layer, which opening is made from the surface of the first portion outside the buried zones(s) until it reaches the sacrificial layer, with at least part of the sacrificial layer being removed by etching through at least one said opening and with the localized zones being etched in such a manner as to form trenches.

The interface layer may include a sacrificial layer in contact with the second region, and the method may include, after step c), a step of removing at least part of said sacrificial layer at least in the vicinity of a said active element.

The sacrificial layer may subsequently be removed at least in part by etching through said openings formed during step c), and etching at least one said cavity and trenches formed in said second region, which may optionally be the trenches of the localized zones.

Prior to said removal of the sacrificial layer, at least one opening out into said sacrificial layer may be made in the first portion outside the buried zone(s).

The first and second portions of the substrate may be constituted respectively from first and second substrates that are assembled together by bonding, at least one of them including at least one said interface layer over at least a fraction of its surface.

The first portion of the heterogeneous substrate may be made from a support made of said first monocrystalline material by a method comprising the following steps:

$a_0$) forming at least one buried zone by:
epitaxially growing a first layer of monocrystalline SiGe on said support;
epitaxially growing a layer of monocrystalline Si; and
epitaxially growing a second layer of monocrystalline SiGe; and $a_1$) epitaxially growing at least one layer of monocrystalline material, at least on the second epitaxial layer of SiGe so as to form at least a portion of the active element;

or else the first portion of the heterogeneous substrate may be made from a monocrystalline silicon support by a method comprising the following steps:

$a'_0$) forming at least one buried zone by making porous silicon in at least a portion of said support; and $a'_1$) epitaxially growing at least one layer of monocrystalline material, at least on the porous silicon so as to form at least a portion of the active element.

The sacrificial layer may be made of PSG or of silica.

The interface layer may include electrical connections for the electromechanical device.

In a first variant, the substrate includes at least two juxtaposed buried zones of equal thickness.

In a second variant, the substrate includes at least two juxtaposed buried zones of different thicknesses.

In a third variant, the substrate includes at least two buried zones that are superposed, at least in part.

When the substrate has buried zones of different thicknesses, the method may include a plurality of successive depositions of SiGe and Si.

In a first implementation, the buried etching zones are made using porous silicon, a material that is known for its use as a sacrificial layer (see the article by P. Steiner, A. Richter, and W. Lang, "Using porous silicon as a sacrificial layer", J. Micromech. Microeng. 3 (1993) 3236). The porous Si zones may be localized by using known masking techniques.

By extension, in the context of the present invention, porous silicon is considered as a monocrystalline material because it conserves a sufficient crystal lattice to enable another monocrystalline material such as silicon to be grown epitaxially thereon.

In a second implementation, the buried etching zones are made by using a set of three layers comprising SiGe, Si, and SiGe.

In an advantageous implementation, the heterogeneous substrate is made by bonding together two substrates, with at least the first substrate being heterogeneous and including the etching zones.

This first substrate may thus be made by making etching zones in a heterogeneous silicon substrate as described above, and then epitaxially growing an active layer of monocrystalline material, with the trenches being made by etching the silicon of the mechanical layer under the cavity(ies).

The method of making the heterogeneous substrate may be continued:

either by filling or closing the trenches (solid or empty regions) in the first substrate, when present, by using a sacrificial material different from Si for chemical etching purposes (selective etching possible), thereby also forming a layer covering the surface of the second epitaxially-grown layer of monocrystalline Si, the sacrificial layer subsequently being planarized if necessary and a second substrate then being bonded on said sacrificial layer;

or else by bonding a second substrate that includes a sacrificial layer, the bonding being performed directly on the trenches.

The method may then comprise:

making through the monocrystalline Si layer of the first substrate at least one opening that extends at least as far as a first etching zone of porous Si (first implementation) or as far as a first etching zone of monocrystalline SiGe, and preferably as far as the first epitaxially-grown layer of monocrystalline Si (second implementation);

optionally making or depositing a layer of protective material on the walls of at least one opening in the second implementation; and selectively removing through the opening(s) at least a portion of the porous Si (first implementation) or of the region of the first epitaxially-grown layer of monocrystalline Si that is situated between a first region of monocrystalline SiGe and the second layer of monocrystalline SiGe (second implementation) so as to form at least one cavity.

The method may then include:
etching the opening(s) filled with sacrificial material and a portion of the sacrificial layer so as to release a MEMS in the second layer of monocrystalline Si when there are trenches or so as to make openings specific for etching a second portion of the sacrificial layer. These openings may be made simultaneously with making the openings that are associated with the etching zones.

During the selective removal step, the method may implement making two or more cavities of equal or different thicknesses that are located side by side. These cavities may be made for providing the base of an integrated cap, two thicknesses of mechanical layer on the same device, or two thicknesses one on the other, or electrodes above the mechanical layer.

When making the layer of monocrystalline Si for the first substrate of at least one opening, at least one said opening may be made through the layer of monocrystalline Si of the first substrate and the first epitaxially-grown layer of monocrystalline Si and extending as far as the sacrificial layer. This variant can be implemented regardless of the number of cavities made in the composite substrate.

BRIEF DESCRIPTION OF THE DRAWINGS

Other characteristics and advantages of the invention appear better on reading the following description, given by way of non-limiting example, and with reference to the accompanying drawings, in which:

FIGS. 4 to 9 show the fabrication of six structures I to VI, specifically I (FIGS. 4a to 4c), II (FIGS. 5a and 5b), III (FIGS. 6a and 6b), IV (FIGS. 7a and 7b), V (FIGS. 8a and 8b), and finally VI (FIGS. 9a to 9c).

MORE DETAILED DESCRIPTION

Figure 1G:
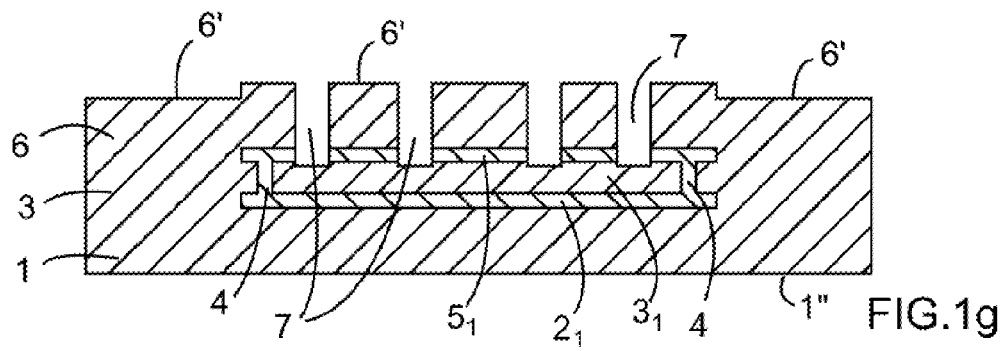
FIGS. 1a to 1o show a preferred method of making a MEMS in a first implementation of the invention, with a variant shown in FIGS. 1h', 1i', and 1o', and another variant in FIG. 1j'''.

The proposed method relies on making a first portion of a heterogeneous substrate, which first portion has one or more buried etching zones that may be etched selectively relative to the silicon in order to make cavities.

In a first implementation, the etching zones in the first substrate are made by an SiGe, Si, and SiGe multilayer structure. This implementation relies on the known possibility of selectively etching SiGe with the etching stopping on Si, or selectively etching Si with the etching stopping on SiGe.

The selectivity of SiGe over Si is small in all known circumstances, but sufficient for use in a frontal attack to remove layers of SiGe on Si. With a lateral attack (releasing a cavity), such selectivity enables structures to be made but only with small form factors.

The selectivity of Si over SiGe can be very great. This property makes it possible to make cavities with large form factors by etching Si, and with the etching being stopped by SiGe.

(Cf. publication by S. Borel et al., "Control of selectivity between SiGe and Si in isotropic etching processes", Japanese Journal of Applied Physics, Vol. 43, No. 6B, 2004, pp. 3964-3966.)

A layer 2 of monocrystalline SiGe, e.g. of thickness lying in the range 10 nm to 300 nm, and typically being 100 nm, with a molar concentration of Ge lying in the range 20% to 60%, is grown epitaxially on a surface of a substrate having a layer 1 of monocyrstalline Si (FIG. 1a).

The layer 2 of SiGe is etched locally to give one or more zones $2_1$ (FIG. 1b).

The choice of thickness for the SiGe layer 2 and of its Ge concentration enable a monocrystalline Si layer 1 to be grown epitaxially on the remaining surface 1' of the layer 1 and on the zone(s) $2_1$ (FIG. 1c), the layer 3 having one or more monocrystalline regions $3_1$, and presenting quality that is sufficient for the mechanical layer 6 of a MEMS that is subsequently grown epitaxially to have satisfactory properties.

FIG. 1c' shows an optional step of etching one or more trenches 4 in a region $3_1$ grown epitaxially on a region $2_1$, the trenches serving to provide lateral etching stops. These trenches 4 may extend solely in the SiGe zone $2_1$, however it is preferable for them to pass through the zone $2_1$. For relatively simple structures, it is possible to omit such trenches 4, with etching then being performed and stopping at the end of a given length of time that is adapted to the width desired for the lateral etching.

A second layer 5 of monocrystalline SiGe is then deposited on the surface (FIG. 1d) and it may subsequently be etched to form one or more zones $5_1$ (as shown), preferably having the same outline as the zone(s) $2_1$ (FIG. 1c).

This operation is followed by epitaxially depositing an Si layer 6 that is subsequently planarized if the SiGe layers do not cover the entire surface, e.g. by chemical-mechanical planarization (CMP) (FIG. 1f), thereby giving a composite monocrystalline substrate 30 containing one or more zones $3_1$ of monocrystalline Si that are sandwiched between two zones $2_1$ and $5_1$ of monocrystalline SiGe, these zones themselves being included in an epitaxially-grown substrate 1, 3, 6, of monocrystalline Si.

In this example, the first portion comprises a first substrate 3 of monocrystalline silicon that has a zone of silicon defined by two parallel planes of SiGe that are typically 100 nm thick (see below). The two parallel planes of SiGe make it possible to use the silicon zone as a sacrificial layer (sacrificial layer of Si in Si) since it is possible to etch the Si selectively, stopping on the SiGe with very good selectivity. The etching zones are defined under such circumstances from the zones $2_1$ and $5_1$ and they also comprise the silicon that lies between these zones.

The steps of FIGS. 1g to 1k show details of making a MEMS from the first substrate 3, in which one and/or the other of the layers 1 and 6 can be used as a mechanical layer for a MEMS.

FIG. 1g shows trenches 7 being made in the layer 6 to define the shape of the active element(s), e.g. by the deep reactive ion etching (DRIE) method through the epitaxially-grown Si layer 6 with stopping after an SiGe layer $5_1$.

Figure 1H:
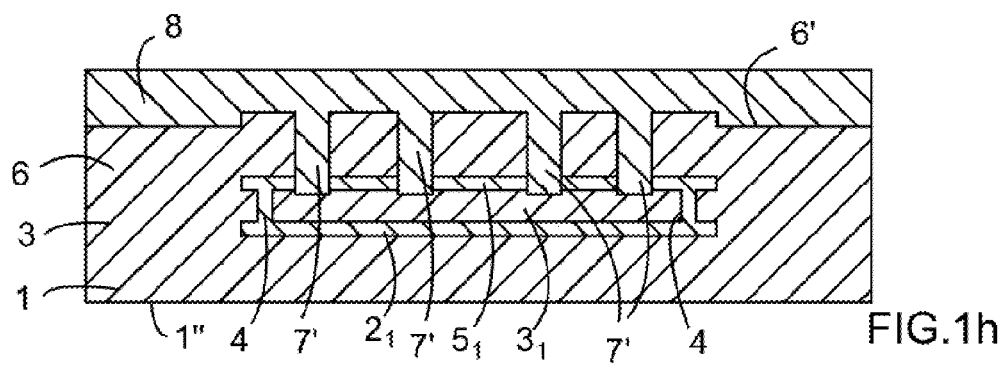
Figure 1I:
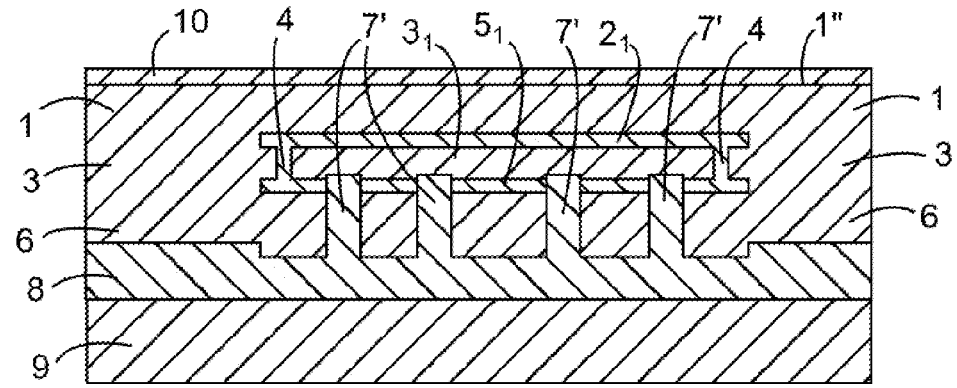

FIG. 1h illustrates depositing a sacrificial layer 8, e.g. of $SiO_2$, that fills the trenches 7 and that covers the surface 6' of the epitaxially-grown layer 6. The filled trenches are given reference 7' and they constitute localized zones connecting the buried zones to the sacrificial layer. These localized zones are subsequently to be etched selectively so as to return to being trenches. These localized trenches define the shape of at least one active element. The sacrificial layer 8 may be planarized, e.g. by CMP. By way of example, it serves as a sacrificial layer for releasing the MEMS defined by the trenches 7.

When the thickness and the size of the trenches do not lend themselves to filling (trenches that are wide and very thick), it is also possible to use a layer 8' that covers the trenches 7 without filling them, e.g. by making use of phospho-silicate glass (PSG). This variant is shown in FIG. 1h' and is continued in FIGS. 1j' and 1o'. This deposit 8' may also act as a sacrificial layer for releasing the regions 29 constituting the MEMS, and there is no need to planarize it. It is also possible to use the known techniques of functionalizing the sacrificial layer (above-mentioned article by Yamamoto) in particular in order to make a bonding layer on the first substrate that is distinct from the sacrificial layer.

This functionalization also makes it possible to make electrical contact leading to the mechanical layer 6 through the sacrificial layer, the contact being associated with an interconnection network placed under the sacrificial layer. It is thus possible to make trenches in the sacrificial layer that are subsequently filled with doped polycrystalline silicon 40 that is also used for making the interconnection tracks 41. The assembly is subsequently covered by a nitride layer 42 and then by a bonding layer 43 of polycrystalline Si or of oxide for bonding a second substrate. It is also possible to make etching stops.

In either situation (1h or 1h'), a second substrate 9 of Si is subsequently bonded, e.g. by molecular bonding, onto the layer 8 or onto the layer 43, and the substrate is turned over (FIG. 1i) enabling the heterogeneous substrate to be obtained.

It is also possible not to deposit the sacrificial layer on the first substrate and, after making the trenches, to bond a second substrate that already includes a sacrificial layer. Under such circumstances, this sacrificial layer may be locally etched, with bonding then taking place with cavities facing one another. Under such circumstances, the interface layer includes an already-etched sacrificial layer. The sacrificial layer may also be made in part on the first substrate and on the second substrate and it may serve as a bonding layer.

The layer 1 is optionally thinned to a thickness that depends on the function performed by the mechanical layer for the MEMS, and also in order to limit the time taken subsequently to etch holes.

Openings are etched in the layer 1, e.g. by the DRIE method, in zones that do not include SiGe, e.g. at the periphery of the component and passing through the entire thickness of silicon, stopping at the oxide. These openings enable pillars of silicon to be created that are electrically insulated from the remainder of the mechanical layer. These pillars could be used for raising various electrical connections towards the top of the component, as shown in the figure.

An oxide layer 10 is deposited or obtained by thermal oxidation of the silicon. Then a dry film is deposited to serve as a mask during subsequent etching operations. Since lithographic operations on the film do not enable the highest levels of resolution to be obtained, it is possible to invert the order of DRIE etches as a function of requirements for the finest etching (contacts or openings).

Figure 1J:
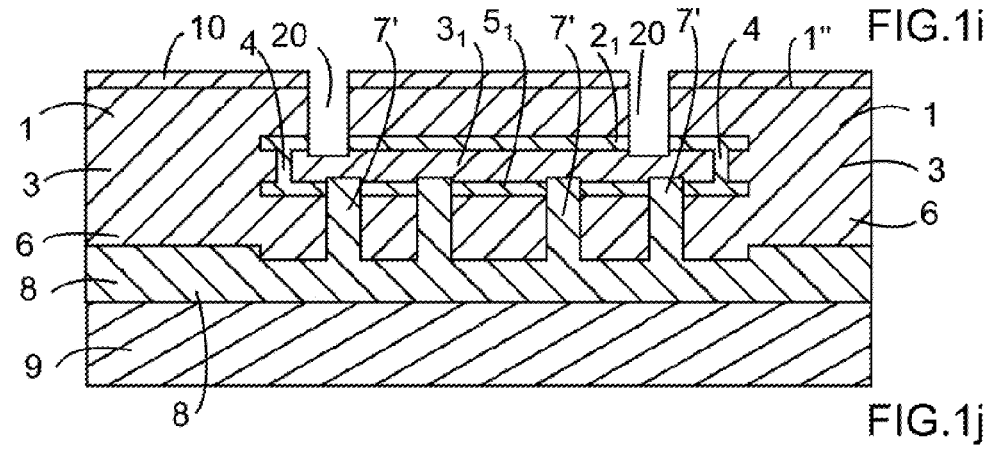
Figure 1K:
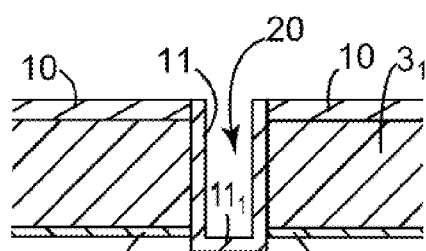

FIG. 1j shows openings 20 being made that are etched in the layer 1 from the surface 1", e.g. by the DRIE method and passing through one or more SiGe zones $2_1$.

FIG. 1j' also provides for making openings 20' situated outside the buried zone(s) ($2_1$, $3_1$, $5_1$) and extending as far as the sacrificial layer 8'.

The edges and the bottoms of the openings 20 are oxidized (FIG. 1k) to perform a protective oxide layer 11, $11_1$ to enable layers $2_1$, 3, and $5_1$ to be etched subsequently (FIG. 1j) so as to form at one cavity 14.

Figure 1L:
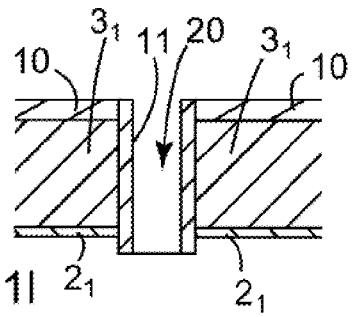

The oxide layer is etched at the bottoms of the openings. FIG. 1l shows the substrate after etching the oxide layer $11_1$ at the bottoms of the openings.

Figure 1M:
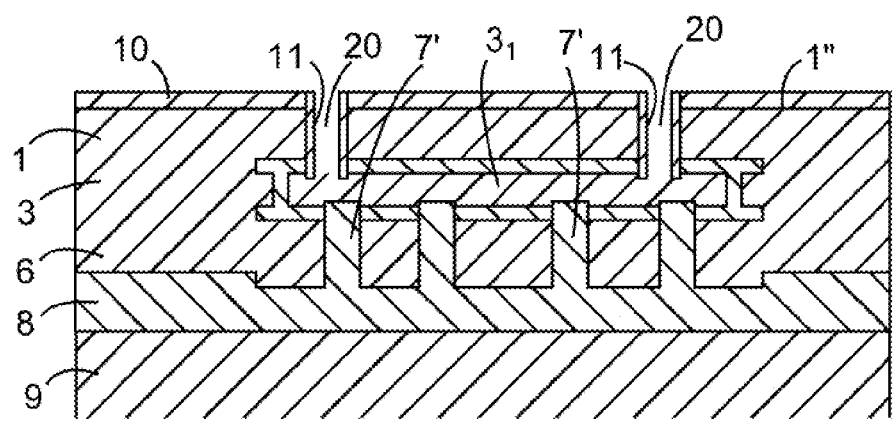
Figure 1N:
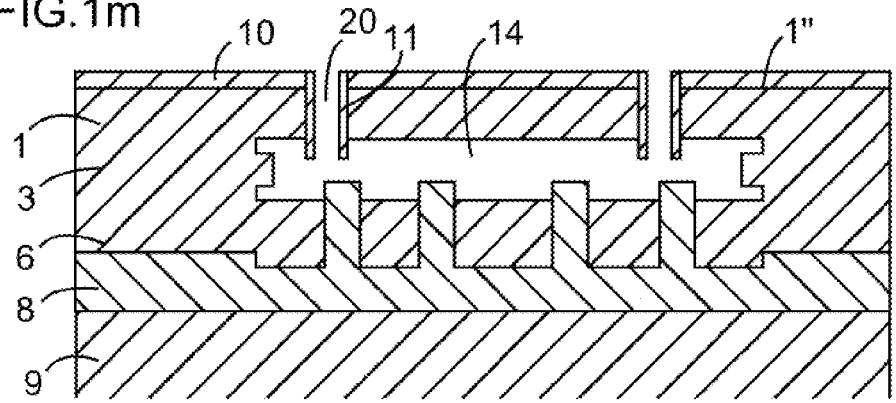

FIG. 1m shows selective etching of the silicon layer $3_1$ (by wet chemical etching or by DRIE) through the release openings 20 so as to form a cavity 14. This etching stops at the SiGe layers $2_1$ and $5_1$, and possibly at the lateral etching stop regions 4. In the absence of lateral etching stop trenches 4, the shape of the cavity 14 may be defined by the spatial disposition of the holes 20 and by the etching time.

Figure in shows the selective etching of the SiGe layers $2_1$ and $5_1$ (by DRIE, cf. the document by S. Borel), with etching stopping at the silicon.

The MEMS may be released (FIG. 1o) by etching the oxide surrounding the holes 20, the filled trenches 7', and the sacrificial layer 8 so as to give cleaned trenches 26 and/or one or more cleaned regions 28 of the sacrificial layer 8 or 8' releasing active regions 29 of the mechanical layer 6.

Figure 1O:
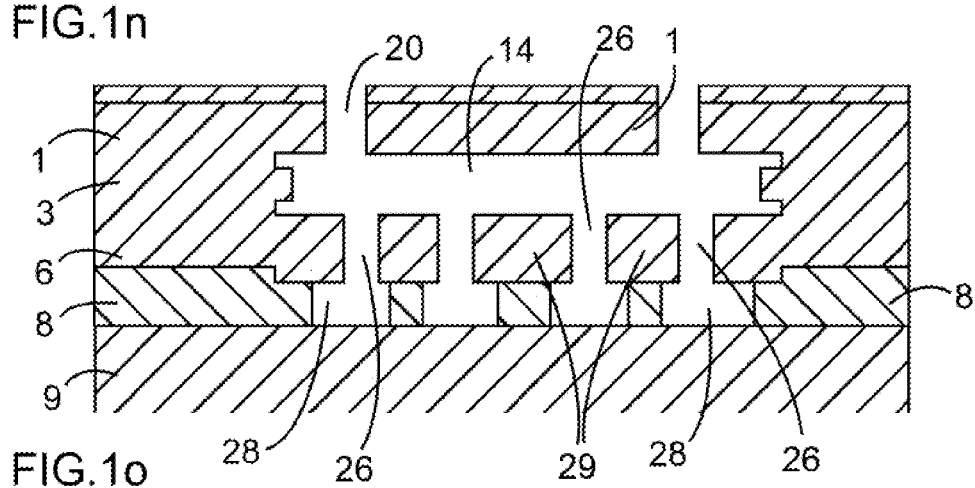

The variant of FIG. 1h' leads, for example, to FIG. 1o, by passing via FIG. 1j' (the other figures are not shown). Under such circumstances, the sacrificial layer 8' is cleaned after one or more cavities 14 have been etched through the conserved trenches 7.

FIGS. 1a to 1o show the situation in which the etching zone is defined completely by the SiGe walls. In a variant implementation, it is also possible to omit etching the SiGe layers 2 and 5 so that they cover the entire substrate, and to make do without lateral etching stops. Under such circumstances, with the buried layer extending to the edge of the first portion of the heterogeneous substrate, one or more cavities are defined by the two parallel planes of SiGe, and the positions of the holes 20 are defined by isotropic attack of the silicon from the holes. This variant makes it possible to avoid the steps of selectively etching the layers of SiGe and of making the etching stops. It also avoids defining a priori the size and position of the or each cavity. The optional step of planarizing the last epitaxially-grown layer of silicon is also omitted. This implementation is therefore simpler and less expensive; however the shapes are less accurately defined, but that might suffice when the shape required of the cavities is simple. This applies for example when making an integrated cap.

A MEMS is thus obtained that is included in a monocrystalline Si substrate with its layer 1 acting as a cap. It may be covered in a layer of PSG that covers at least the trenches 11.

The layer 1 may also serve to make electrodes on top of the mechanical layer. The openings made then serve both to provide access to the zones for making the cavities and also for structuring electrodes. These electrodes need to be electrically insulated from the remainder of the mechanical layer (see diagram concerning the shapes of the cavities and the associated functions). The electrical contact leading to the mechanical portion may be accessible from pillars of silicon found outside the cap zone or from electrodes connected to certain portions of the mechanical layer via tracks and pillars of doped polycrystalline silicon passing under or through the sacrificial layer.

The sacrificial layer 8 may be used to make contacts by means of localized deposits of a conductive material, e.g. polycrystalline Si, in the trenches 7 between the steps of FIGS. 1g and 1h, and/or to make reinforcing pillars by etching and deposition, e.g. pillars of silicon nitride. Other trenches may be provided for making contact points.

The sacrificial layer 8 may also receive conductive areas, e.g. of polycrystalline Si, for the purpose of making interconnections.

FIG. 1j" shows the situation in which at least one opening 80 is formed through the layers 1, 3, and 6 outside the buried zone(s) so as to reach the sacrificial layer 8. This makes it possible to remove at least a portion of the sacrificial layer 8 selectively and then to etch the localized zones 7' to make the cleaned trenches 26.

In the second implementation of the method, at least one etching zone in the first substrate is made of porous silicon.

Figure 2A:
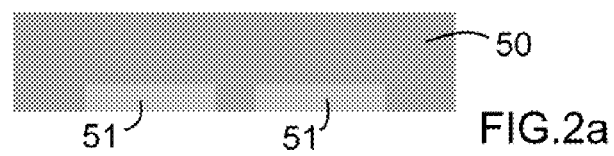
FIGS. 2a to 2f show a method of making a MEMS in a second implementation of the invention, using porous Si.
Figure 2B:
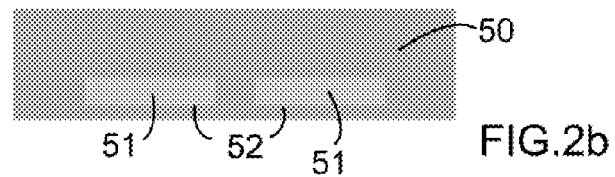

The first composite substrate is made from an Si substrate 50 in which, after masking, one or more etching zones 51 of porous Si (FIG. 2a) are made using a technique of electrochemically dissolving Si in HF (see for example the article "Using porous silicon as sacrificial layer" by P. Steiner, J. Micromech. Microeng. 3 (1993) 3236). Thereafter, a layer of monocrystalline is grown epitaxially (FIG. 2b). If cavities of different thicknesses need to be made, the operation can be repeated: making a new etching zone superposed on an etching zone 51 after masking and then epitaxially growing Si a second time.

Trenches may be made in the last Si layer to be made (52 or the additional layer when there are cavities of different thicknesses), which layer acts as a mechanical layer. These trenches, e.g. made by DRIE attack, open out into one or more zones 51 of porous Si that are to form cavities obtained by selective etching of the zones 51.

Figure 2C:
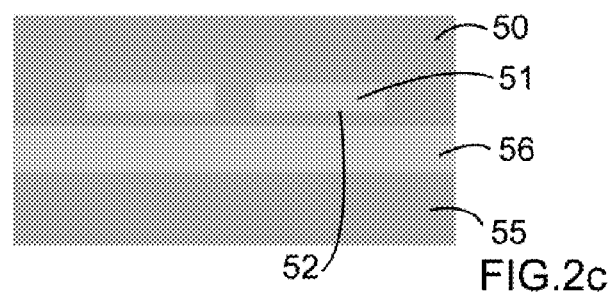

A second substrate 55 having a surface oxide layer 56 is then bonded on the first substrate by a known method of the molecular bonding type (FIG. 2c).

Figure 2D:
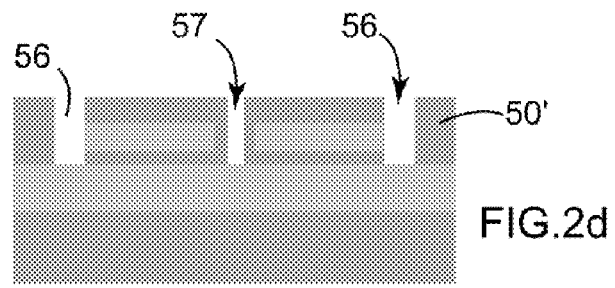
Figure 2E:
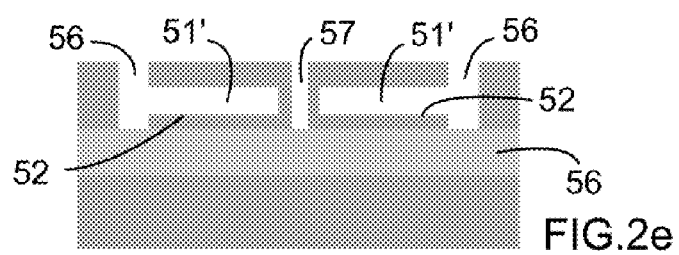

Openings are then made in the top layer 50 of Si of the first substrate, where necessary after thinning said layer 50' both for etching the etching zone (openings 56) and for etching the sacrificial layer (openings 57) (FIG. 2d). The porous silicon of the etching zone 51 is then etched to form cavities 51' with the etching stopping on the Si, e.g. by using a solution having a low concentration of KOH, typically a concentration of 1%. The shape of the cavities is determined by the combination of the positions of the release trenches 56 and of the zones 51 of porous Si (FIG. 2e).

Figure 2F:
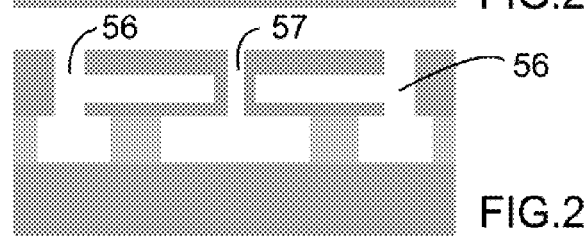

Finally, the mechanical layer 51' is released by etching the sacrificial layer through the openings 56 and 57 (FIG. 2f).

It is also possible to replace the porous Si etching zones with zones of highly doped silicon, but the resulting selectivity is not so good.

It is also possible to use the method as described for making cavities above other monocrystalline materials so as to obtain physical properties, including small thickness, close to the properties of bulk monocrystal or at least better than those obtained for the same material obtained in an amorphous or polycrystalline phase. In the perovskite family, this applies for example to PZT that may be grown epitaxially from a monocrystalline transition layer of $SrTiO_3$ (STO perovskite) on monocrystalline silicon, with piezoelectric properties that are potentially different than those of amorphous or polycrystalline films made in particular by a sol-gel deposition method (above-mentioned article by A. Lin et al.). In order to use this material, e.g. for implementing piezoelectric detection, it is possible to make an electrode under the PZT layer by using likewise monocrystalline $SrRuO_3$. It is also possible to use the same approach by replacing the PZT with PMNT.

Figures 3A, 3B:
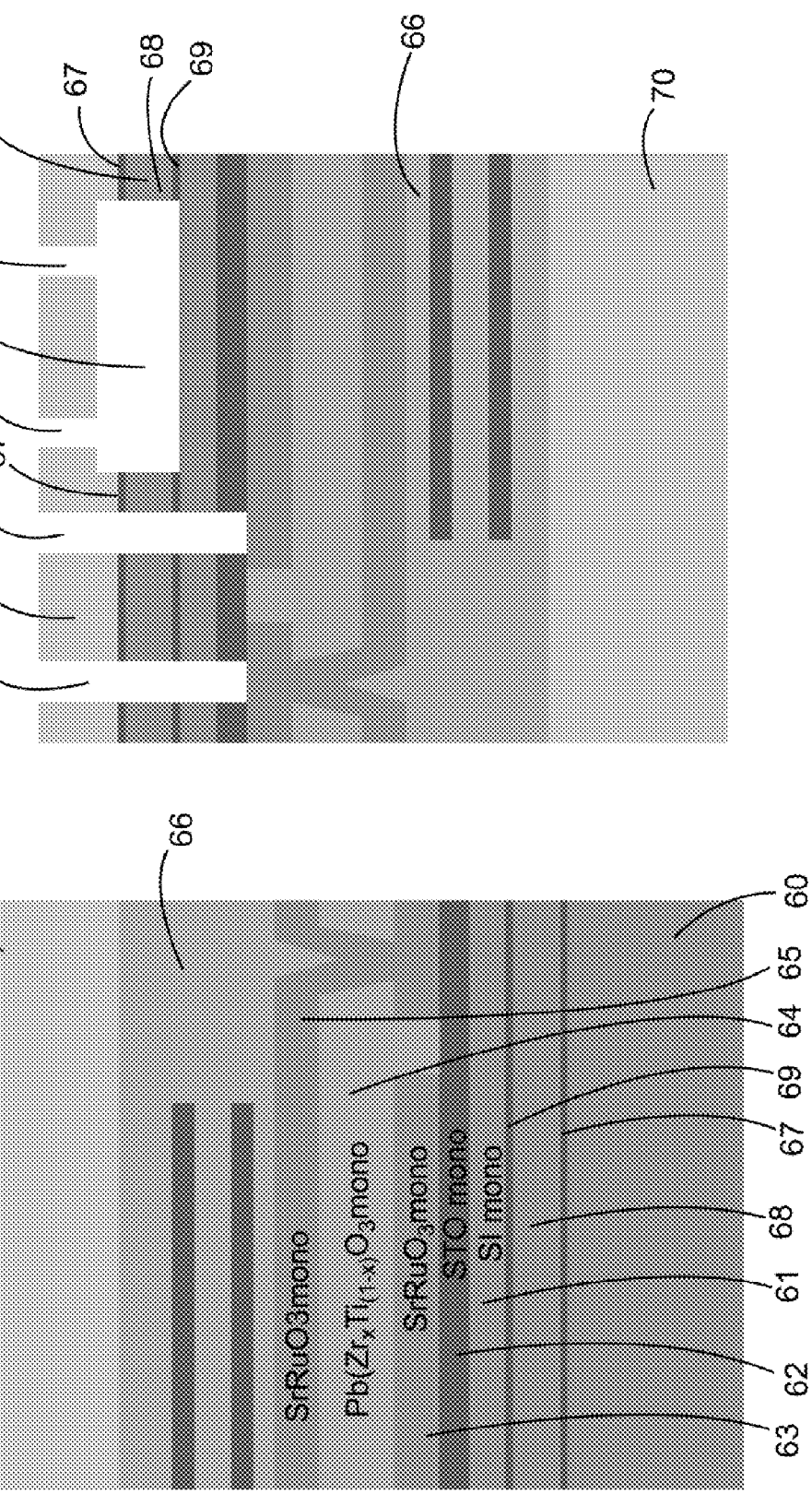
FIGS. 3a and 3b show a bulk acoustic wave piezoelectric resonator being made.

This possibility is illustrated by an implementation of the invention for making a bulk acoustic wave (BAW) piezoelectric resonator with an integrated cap, as shown in FIGS. 3a and 3b.

The buried zone made up of a stack of SiGe 67, Si 68, and SiGe 69 is made as in the first example on a substrate 60 of monocrystalline silicon. A transition layer made of a layer of monocrystalline silicon 61 and a monocrystalline layer of STO perovskite 62 is then grown epitaxially (STO means for $SrTiO_3$). The piezoelectric stack is made up of electrodes 63 and 65 of monocrystalline $SrRuO_3$ associated with a piezoelectric layer 64 of monocrystalline PZT using a known method (above-mentioned article by A. Lin et al.). Local etching of the first electrode and of the PZT layer make it possible to use the first layer 63 of $SrRuO_3$ both as the first electrode and to make an electrical connection to the second electrode 65. A Bragg mirror 66 is then made on top of the portion of the resonator that is subsequently released using a known method of depositing a multilayer of $SiO_2$ by PECVD and of W (by sputtering). Each deposit of $SiO_2$ is followed by CMP to obtain a plane structure. The various thicknesses are defined by the resonant frequency of the resonator. The last layer of $SiO_2$ may also act as a bonding layer for bonding a second substrate 70, preferably oxidized and acting as a support (FIG. 3a).

The resulting heterogeneous substrate is then turned over and the first substrate 60 is thinned 61' by rectification to obtain a thickness that is typically 100 μm (FIG. 3b). Openings are made by DRIE and the cavity 72 is obtained by etching the SiGe 67, Si 68, and SiGe 69, etching being stopped laterally. The openings 71 are finally vacuum-sealed with a layer of PSG. The contacts to the electrodes may be made through the trenches 73 made in the layers of SiGe and Si by DRIE, with the STO bottom 62 being removed by fast vapor HF etching (FIG. 3b) so as to reach the $SrRuO_3$ electrodes 63.

The component thus obtained is a BAW resonator of the solid mounted resonator (SMR) type with an integrated cap 70 of monocrystalline silicon.

It is also possible to combine the various proposed implementations, e.g. the type of cavity (porous Si or SiGe/Si), the existence or non-existence of a sacrificial layer, the position of the sacrificial layer prior to bonding the second substrate (on the first substrate with normal bonding on the second substrate with "on-cavity" bonding or with bonding distributed over the first and second substrates), release of the mechanical structure by etching the sacrificial layer through the cavities or via specific openings, and/or etching localized zones through the cavities or from the sacrificial layer.

FIGS. 4 to 9 show the fabrication of six structures using the buried cavity principle. Each figure comprises the description of the associated heterogeneous substrate after the step of the method, and then at the end of the method. Each structure described corresponds to different given shapes for the etching zones, thereby illustrating the types of function that can be achieved.

I) Heterogeneous substrate (FIGS. 4a to 4c) having a single etching zone covering practically all of the components and trenches enabling an integrated cap to be made (first mechanical layer 1) and the mechanical structure to be made (second mechanical layer 6). This shape corresponds to FIGS. 1a to 1o. When this configuration includes replugging the openings, it can be used for making an inertial structure with an integrated cap. The first mechanical layer 1 may also be used for making top electrodes. It is possible to combine both functions (cap and electrodes) by replugging with an insulator, e.g. PSG. The electrical connections may be made from the top face of the substrate, directly for the electrodes or the cap, and through pillars of monocrystalline silicon and interconnection of doped polycrystalline silicon for the mechanical portion. This type of connection may also be used in the other configurations.

II) Heterogeneous substrate having an etching zone occupying part of the space of the component thus making it possible to make two elastic structures 81 and 82 of different thicknesses, one of which extends to the surface and the other of which is buried, the shape of the thick structure 81 being etched prior to releasing the cavities (FIGS. 5a and 5b). Contacts to the shallower mechanical layer may be made through an interconnection layer of silicon placed under and through the sacrificial layer.

III) Heterogeneous substrate having two buried zones 102 and 103 of different thicknesses placed beside each other (FIGS. 6a and 6b) and covering practically all of the components, with trenches 86 and 87 enabling a MEMS component to be made with an integrated cap and two thicknesses for the mechanical structure, e.g. for making two elastic structures 84 and 85 of different thicknesses without a single accelerometer, or else for making two accelerometers on a single component (measuring acceleration in the plane and outside the plane), or for making electrodes on top of the mechanical layer. When the etching zones are made from three layers of SiGe—Si—SiGe, the deep etching of both mechanical layers may be performed simultaneously. Otherwise, it is necessary to use a dry film, beginning with the etching that requires more critical accuracy.

IV) Heterogeneous substrate having two etching zones 91 and 92 of the same thickness in the same plane, and trenches 93 and 94 enabling a MEMS component to be made having two superposed components that are mechanically interconnected (FIGS. 7a and 7b). This configuration may be used for making a mass 97 (thick first mechanical layer 1) that is rigidly connected by the region 97 to a mechanical structure 98 (thin second mechanical layer 6).

V) Heterogeneous substrate having two etching zones 101 and 102 of the same thickness and in the same plane, without trenches, enabling a fine suspended mechanical structure 103 to be made that is associated with a mass 104 (FIGS. 8a and 8b). The sacrificial layer is etched from specific openings.

VI) Heterogeneous substrate identical to V), but either with bonding on cavities so that no etching of the sacrificial layer is required after bonding, or else with release of the mechanical structure by openings 106 made from the rear face of the component (FIGS. 9a and 9b).

What is claimed is:

1. A method of fabricating an electromechanical device on at least one substrate, the electromechanical device including at least one active element the method comprises:
   a) making a heterogeneous substrate comprising a first portion, an interface layer, and a second portion, the first portion including one or more buried zones sandwiched between first and second regions formed in a first monocrystalline material, the first region extending to the surface of the first portion, and the second region extending to the interface layer, at least one said buried zone being made at least in part out of a second monocrystalline material so as to make it selectively attackable relative to the first and second regions;
   b) making openings from the surface of the first portion and through the first region, which openings open out to at least one said buried zone; and
   c) etching at least part of at least one buried zone to form at least one cavity so as to define at least one active element that is at least a portion of the second region between a said cavity and said interface layer;
   wherein the first and second portions of the substrate are constituted respectively from first and second substrates that are assembled together by bonding, at least one of them including at least one said interface layer over at least a fraction of its surface.

2. A method according to claim 1, wherein the second region presents localized zones extending between at least one buried layer and the interface layer in such a manner as to define a shape of at least one active element.

3. A method according to claim 2, wherein said localized zones are trenches.

4. A method according to claim 2, wherein said localized zones are solid and are etched after step c) so as to form trenches.

5. A method according to claim 2, wherein the localized zones are solid, wherein the interface layer includes a sacrificial layer in contact with the second region, and wherein the method includes making at least one opening out into said sacrificial layer, which opening is made from the surface of the first portion outside the buried zones(s) until it reaches the sacrificial layer, with at least part of the sacrificial layer being removed by etching through at least one said opening and with the localized zones being etched in such a manner as to form trenches.

6. A method according to claim 1, wherein the interface layer includes a sacrificial layer in contact with the second region, and wherein the method includes, after step c), a step of removing at least part of said sacrificial layer at least in the vicinity of a said active element.

7. A method according to claim 6, wherein the sacrificial layer is removed at least in part firstly by etching through said openings made in step c), and secondly by etching at least one said cavity, and finally trenches formed in the second region.

8. A fabrication method according to claim 6, wherein prior to said removal of the sacrificial layer, at least one opening out into said sacrificial layer is made in the first portion outside the buried zone(s).

9. A method according to claim 1, wherein the first portion of the heterogeneous substrate is made by a method starting from a support made of said first monocrystalline material, and comprising the following steps:
   $a_0$) forming at least one buried zone by:
      epitaxially growing a first layer of monocrystalline SiGe on said support;
      epitaxially growing a layer of monocrystalline Si; and
      epitaxially growing a second layer of monocrystalline SiGe; and
   $a_1$) epitaxially growing at least one layer of monocrystalline material, at least on the second epitaxial layer of SiGe so as to form at least a portion of the active element.

10. A method according to claim 1, wherein the first portion of the heterogeneous substrate is made by a method starting from a monocrystalline silicon support and comprising the following steps:
   $a'_0$) forming at least one buried zone by making porous silicon in at least a portion of said support; and
   $a'_1$) epitaxially growing at least one layer of monocrystalline material, at least on the porous silicon so as to form at least a portion of the active element.

11. A method according to claim 9, wherein the localized zones connected at least one buried zone to the interface layer are made by etching trenches at least in the layer(s) grown epitaxially in step $a_1$) or $a'_1$).

12. A method according to claim 5, wherein the sacrificial layer is made of PSG or of silica.

13. A method according to claim 1, wherein the interface layer includes electrical connections for the electromechanical device.

14. A method according to claim 1, wherein the substrate includes at least two juxtaposed buried zones of equal thickness.

15. A method according to claim 1, wherein the substrate includes at least two juxtaposed buried zones of different thicknesses.

16. A method according to claim 1, wherein the substrate includes at least two buried zones that are superposed, at least in part.

* * * * *